United States Patent
Hartemann

[11] 3,963,997
[45] June 15, 1976

[54] DEVICE FOR THE DIRECTIVE TRANSMISSION OF ELASTIC SURFACE WAVES AND PROCESS FOR MAKING THE SAME

[75] Inventor: Pierre Hartemann, Paris, France
[73] Assignee: Thomson-CSF, Paris, France
[22] Filed: Oct. 25, 1974
[21] Appl. No.: 518,218

[30] Foreign Application Priority Data
Oct. 30, 1973 France .............................. 73.38638

[52] U.S. Cl. .............................. 333/30 R; 310/8.2; 310/9.5; 333/72
[51] Int. Cl.² ..................... H03H 9/26; H03H 9/30; H01L 41/18; H01L 41/22
[58] Field of Search .............. 333/30 R, 72; 310/8.1, 310/8.2, 9.5–9.8; 252/62.9; 350/96 WG; 427/38–40

[56] References Cited
UNITED STATES PATENTS

| | | | |
|---|---|---|---|
| 3,406,358 | 10/1968 | Seidel et al. | 333/30 R X |
| 3,626,334 | 12/1971 | Keyes | 333/30 R |
| 3,655,457 | 4/1972 | Duffy et al. | 148/1.5 |
| 3,697,899 | 10/1972 | Dias | 333/72 X |
| 3,753,157 | 8/1973 | Ash et al. | 333/30 R X |

OTHER PUBLICATIONS
Barrekette et al., "Multichannel Guide for ASW Memories," IBM Technical Disclosure Bulletin vol. 14, No. 4, Sept. 1971, 1295–1298.

Ash et al., "Microsound Surface Waveguides," in IEEE Trans. on Microwave Theory and Techniques, vol. MTT-17, Nov. 1969, pp. 882–885.

Williamson et al., "The Use of Surface–Elastic–Wave Reflection Gratings in Large Time–Bandwidth Pulse–Compression Filters," in IEEE Trans. on Microwave Theory and Techniques, vol. MTT 21, Apr. 1973, pp. 195–197.

*Primary Examiner*—Alfred E. Smith
*Assistant Examiner*—Marvin Nussbaum
*Attorney, Agent, or Firm*—Cushman, Darby & Cushman

[57] ABSTRACT

The invention relates to the directive transmission of elastic surface waves. The object of the invention is a device comprising a crystalline substrate on whose surface elastic surfaces waves can be propagated. The value of surface-wave phase velocity can be changed by local modification of the crystalline lattice structure in a directive zone formed immediately below the surface. The structural modification of the lattice structure can be produced by ion implantation.

19 Claims, 8 Drawing Figures

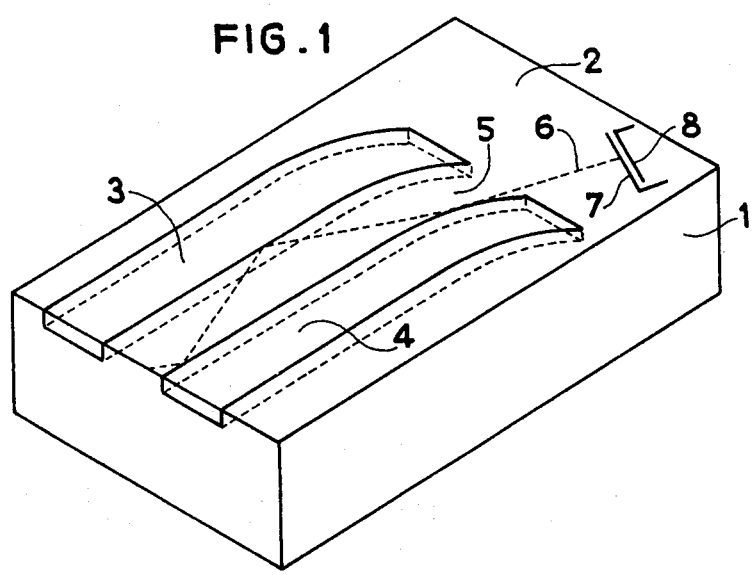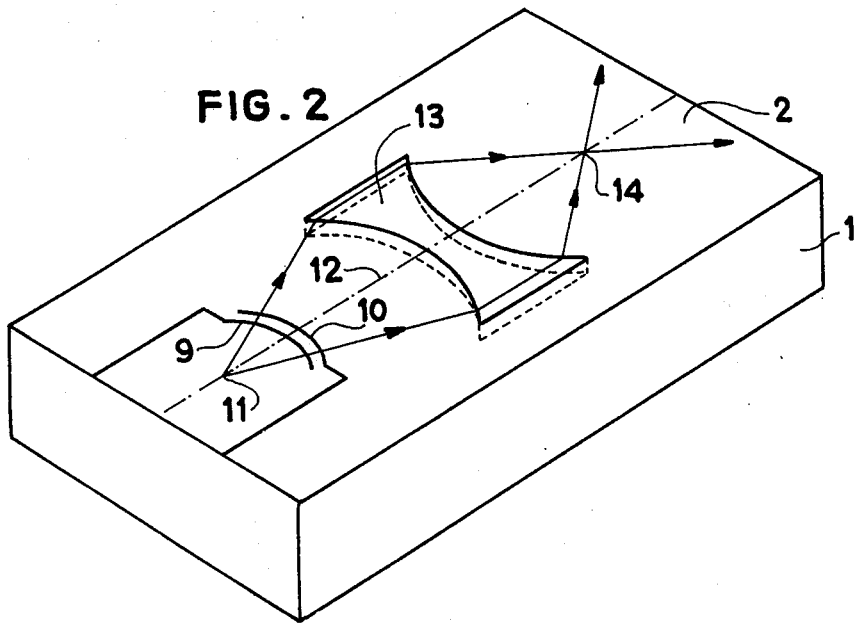

FIG. 3
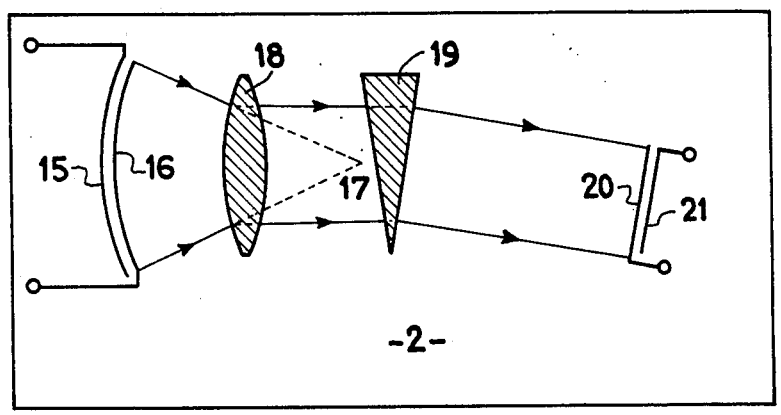
FIG. 4
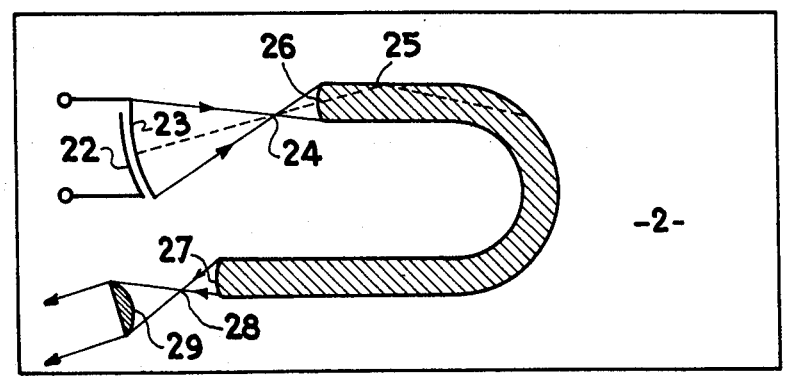
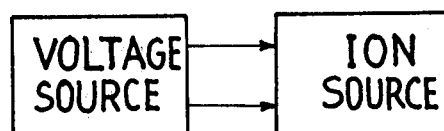
FIG. 5
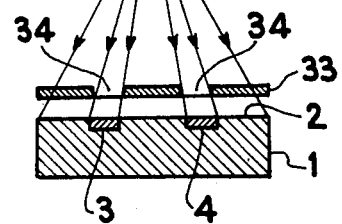

DEVICE FOR THE DIRECTIVE TRANSMISSION OF ELASTIC SURFACE WAVES AND PROCESS FOR MAKING THE SAME

The invention relates to elastic surface wave devices having a propagation medium in the form of a substrate on whose surface vibratory waves such as Rayleigh waves can be propagated in a straight line. At high frequencies surface waves have a short wavelength and little penetration depth. By way of example, these two parameters come to a few tens of microns in the case of a quartz substrate with an excitation frequency in the order of 100 megahertz. Consequently, at these frequencies rectilinear propagation is interesting in itself, but it is also of great practical utility to be able to control propagation so as to have directive transmission. For directive transmission of the vibratory energy contained in elastic surface waves, a technique can be used for guiding them along a straight or curved path contained in the substrate surface. Another possibility is to use a sequence of catoptric or dioptric systems which can provide multiple focusing of the vibratory energy at the substrate surface.

Both such forms of directive transmission of elastic surface waves are possible if an appropriate elastic layer is deposited on the substrate surface on the path of the waves or if such surface is notched on such path, to provide local action of the propagation. These means have found to be relatively inefficient and relatively delicate to use.

To obviate these drawbacks, the invention proposes selectively producing a change in the propagation speed on the surface of a crystalline substrate by modifying the physical properties thereof in selected zones which are disposed immediately below such surface. A process which can help to provide this modification immediately below the crystalline substrate surface is to use ion implantation to produce a local change in the lattice structure of the crystalline substrate.

In accordance with a first object of the invention, there is provided a device for the directive transmission of elastic surface waves, comprising: a crystalline substrate having a surface for propagating said elastic surface waves, and at least one directive zone formed in a portion of said substrate, said directive zone extending immediately below said surface; said directive zone having a structure permanently modified in relation to the lattice structure of the adjacent portions of said substrate, for causing a change in the phase velocity of said elastic surfaces waves within the extent of said directive zone.

In accordance with a further object of the invention, there is provided a method for permanently modifying in the extent of a predetermined zone the phase velocity of elastic surface waves propagated along the surface of a crystalline substrate, said method comprising the steps of: making an ion implanted layer within the extent of said predetermined zone by selectively directing a beam of accelerated ions toward said surface, and varying the accelerating potential of said ions in the course of the implanting for producing an unburied zone having a structure permanently modified in relation to the lattice structure of the adjacent portions of said substrate.

For a better understanding of the present invention and to show how the same may be carried into effect, reference will be made to the ensuing description and to the accompanying drawings among which:

FIG. 1 shows a first embodiment of the directive transmission device according to the invention;

FIG. 2 shows a second embodiment of the directive transmission device according to the invention;

FIG. 3 shows a variant of the device according to the invention;

FIG. 4 shows another variant of the device according to the invention;

FIG. 5 shows a process for producing directive transmission devices according to the invention.

Figure 6:
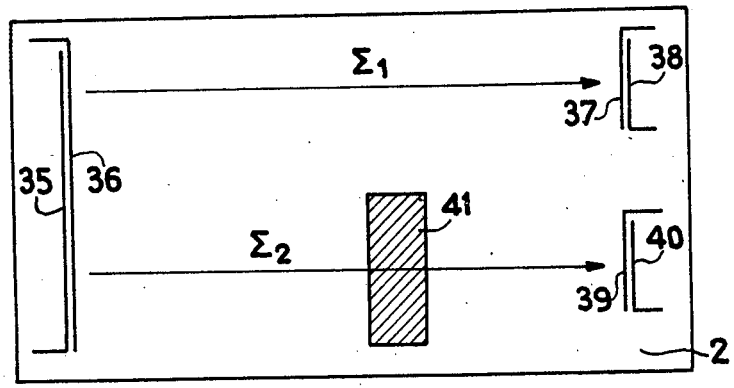
FIGS. 6 to 8 are plan views showing other variants of the device according to the invention.

Referring to FIG. 1, there can be seen a device providing directive transmission of elastic surface waves and of use more particularly for guiding such waves. The device comprises a crystalline substrate 1, for instance, of quartz, having a surface 2 on which elastic surface waves such as for example Rayleigh waves are launched by means of an electromechanical comb transducer 7, 8. Transducer 7, 8 consists of two conductive electrodes 7, 8 deposited on substrate surface 2. When an a.c. voltage is applied across the electrodes 7 and 8, the transmitting gap therebetween transmits Rayleigh waves in a direction 6. The vibratory plane of the waves is perpendicular to surface 2 and parallel to the direction 6; neglecting diffraction phenomena, wave propagation is rectilinear along the perpendicular 6 to the transmission gap if the substrate is completely isotropic. In effect the vibratory energy radiated by the transducer 7, 8 is contained in a beam whose divergence depends upon transmission gap length measured in wavelengths. This divergence hampers complete transmission of the vibratory energy to a distant receiver; also, the transducer must be positioned appropriately for such energy to reach any desired position of surface 2.

According to the invention, to provide a directive transmission of the vibratory energy of the surface waves, two directive zones 3, 4 for guiding the waves are formed below the surface 2. The crystal gap separating the two zones 3 and 4 from one another therefore acts as an acoustic wave guide. If the same is to operate satisfactorily, the physical properties of the substrate must be so modified in the region of the zones 3 and 4 that the elastic surface waves are propagated in such zones with a higher phase velocity than in the crystal gap between the zones.

In this condition there exists a limit total reflection angle beyond which the guided propagation mode can occur between the two directive zones 3 and 4. This phenomenon is indicated in FIG. 1 by a broken line which extends the direction 6; such line symbolizes the appearance of the guided propagation mode of the surface waves in the crystal gap whose lateral boundaries are the two zones 3 and 4. This confining is sufficient since elastic surface waves become attenuated rapidly at departure from the surface. Preferably, the zones 3, 4 are contained in a substrate portion contiguous with the substrate surface.

A process which can be used to contrive the zones 3, 4 is to produce a local modification of the substrate crystalline lattice structure by ion implantation, for of course a comparison of the phase velocity of Rayleigh waves at the surface of a crystalline quartz substrate with their phase velocity in the presence of amorphous quartz shows the latter phase velocity to be approximately 8 percent greater than the former. Consequently, implanting the surface of a crystalline quartz block with light ions such as the ions $4_{He}+$, $7_{Li}+$, $9_{Be}+$, $10_B+$ and $40_A+$, is found by experiment to produce an increase $\Delta V$ of phase velocity V of up to 1 percent for a dose of $10^{16}$ ions/cm$^2$ and an accelerating energy of 100 keV.

The experimental results given in the following table for an elastic surface wave frequency of 180 MHz show a relative phase velocity variation $\Delta V/V$ expressed as a percentage for a number of light ions implanted in crystalline quartz with an energy of 100 keV. The dosage used is $10^{16}$ and the raising $e$ of the implanted zone measured in angstroms is shown in the table.

| nature of ion | V/V% | eA |
|---|---|---|
| $1_H$ | 0 | 100 |
| $4_{He}$ | +1.1 | 1000 |
| $7_{Li}$ | +1.1 | 1200 |
| $9_{Be}$ | +1 | 1000 |
| $11_B$ | +0.5 | 400 |
| $40_A$ | +0.1 | 350 |

Clearly, the relative phase velocity increase $\Delta V/V$ is greatest for the $H_e^+$ and $L_i^+$ ions and zero for the $H^+$ ion. The zero finding is probably because at the energy considered the $H^+$ form an implanted zone which does not outcrop on the substrate surface and which is too thin as well.

According to the invention, to achieve a relative phase velocity increase $\Delta V/V$ of a few per cent. at frequencies above 100 MHz, an unburied implanted zone is formed. To this end, the implantation energy is varied during ion implantation, for instance, by increasing the accelerating voltage in increments from an initial value of the order of 10 kV. The directive transmission device shown in FIG. 1 is based on guiding elastic surface waves between two guiding zones.

There are other possible forms of directive transmission of elastic surface waves. The vibratory radiation can be transmitted by means of focusing zones which are disposed consecutively along the path of the radiation and which can be reflecting or refracting.

FIG. 2 shows a crystalline quartz substrate 1 on whose surface 2 a transmitting transducer of elastic surface waves has been installed. The transducer comprises e.g. two curved electrodes 9, 10 and a transmission gap able to radiate a divergent vibratory wave whose phase centre is at a position 11, such position being the centre of the curvature of the transmission gap. For guided transmission of the diverging vibratory radiation output by the transducer 9, 10, substrate 1 is formed with a directive zone 13 which outcrops on to surface 2 and whose structure has been so modified that the elastic surface waves propagating in the zone 13 travel faster than in adjacent portions. The shape of the zone 13 is that of a lens which is thinner at the centre than at its edges. The vibratory energy is therefore focused at the convergence point 14 and so the zone 13 acts as an acoustic lens for the elastic surface waves. The line 12 in FIG. 2 has a similar function to the optical axis of a glass lens and consecutive zones 13 can be provided at close intervals along the line 12 as a means of directively transmitting the vibratory energy.

The form of elastic surface wave refraction shown in FIG. 2 is such that positive or negative acoustic lenses can be devised. In the latter case the shape of the zone 13 must be thicker at the centre than at the edges.

FIG. 3 is a plan view of a variant of the directive transmission device according to the invention and comprises a crystalline quartz substrate having on its surface 2 a transducer transmitting elastic surface waves; conductive electrodes 15, 16 of the transducer bound a curved transmission gap which can transmit a vibrating radiation towards a convergence point 17.

A receiving transducer for elastic surface waves is formed on surface 2 by means of two electrodes 20, 21 which bound a straight gap.

Directive transmission of surface waves between the transmitting and receiving transducers is by way of two directive zones 18, 19 which are shown hatched in FIG. 3. The first zone 18 encountered by the transmitting vibratory radiation is in the form of a convex lens which can cancel the convergence of the incident rays. The parallel beam issuing from zone 18 has its direction changed by passing through the triangular zone 19 which acts as a prism.

As the foregoing description shows, the provision of appropriately shaped directive zones which are flush with the surface of a crystalline substrate is a means of reflecting or refracting elastic surface waves in the two-dimensional space in which they are confined. Another possibility is the association of a number of directive zones with one another to form an array for diffracting elastic surface waves. If a pitch or spacing appropriate for the wavelength is chosen, such an array can be used as a reflector having a high reflectivity factor.

Figure 7:
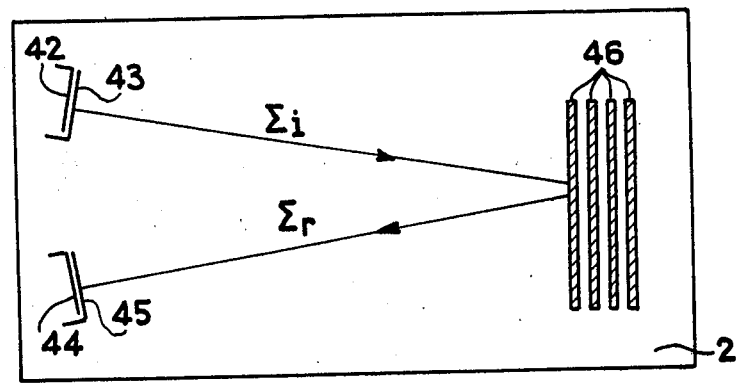

FIG. 7 is a plan view of a crystalline substrate on whose surface 2 there can be seen a transmitting transducer 42, 43 and a receiving transducer 44, 45. A network of equidistant guide zones 46 forms a composite reflector from which the incident vibratory radiation $\Sigma_i$ is reflected as a reflected radiation $\Sigma_r$.

Figure 8:
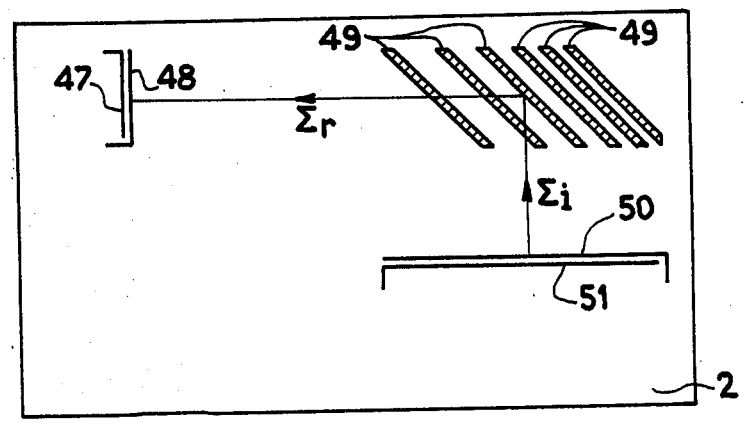

FIG. 8 is a plan view of a transmission device similar to the device of FIG. 7; it also comprises a transmitting transducer 50, 51 and a receiving transducer 47, 48 for respectively transmitting the vibratory radiation $\Sigma_i$ and collecting the same. Reflecting network 49 is embodied by nonequidistant guide zones to give a dispersive characteristic to the delay line thus devised. Of course, the networks of FIGS. 7 and 8 can also be used for transmission, inter alia to split an elastic surface wave beam.

The devising and dimensioning of the directive zones obey laws similar to optical laws and more generally similar to the laws governing electromagnetic wave propagation. In this connection the idea of an index for elastic surface waves can be introduced; it can be seen that the index of the guiding zones is smaller than the index of the zones adjacent them in the devices shown in FIGS. 1 to 3.

Without departing from the scope of this invention, directive zones having a higher index than the adjacent regions can be formed at the surface of a crystalline substrate. A corresponding variant of the invention is shown in FIG. 4 which is a plan view of a crystalline substrate having on its surface 2 a transducer for transmitting elastic surface waves. Transducer 22, 23 is of similar structure to the transducer 15, 16 to FIG. 3 but is associated with two guide zones 25, 29 which are shown hatched and within which the elastic surface wave refraction index has been increased by a reduction in propagation speed. The vibratory energy radiated by the transducer 22, 23 is focused in the low index region at the focus or convergence point 24. The vibratory energy issuing therefrom is coupled with the guide zone 25 by way of a convex input surface 26. Zone 25 guides the energy as far as output surface 27 which is so shaped that the energy converges at a focusing or convergence point 28. A second guide zone 29 serves as a converging lens and, since the focus of zone 29 is at point 28, zone 29 outputs a parallel beam of vibratory energy.

The zones 25, 29 can be formed by an ion implant process.

If a lithium niobate substrate is used and the guide zones are implanted at a dose of $10^{15}$ ions/cm$^2$, the propagation speed in the zones thus treated is reduced by up to 0.8 percent, relatively to such speed outside the guide zones, at an elastic surface wave frequency of 180 MHz.

FIG. 5 is a diagrammatic view of an installation for contriving guide zones by ion implantation.

As is known, an ion implanter 31 comprises: an ion source in which a vaporized doping agent is ionized by means of electrons emitted by a heated filament; an ion exit aperture, an acceleration zone to which an adjustable voltage power supply 30 applies an accelerating voltage; a magnetic filter for sorting the required ions; and a sweeping or scanning zone for uniform seeding of the surface where the ions are to be implanted. Substrate 1 is disposed so as to receive on its surface 2 an accelerated ion beam 32. To confine the zones 3, 4 to be formed in the substrate, a mask 33 is provided whose apertures 34 match the shape of the zones 33. If the accelerating voltage of the power supply 30 is varied during implantation, the directing zones can be arranged to be flush with the substrate surface 2 and to have sufficient depth in the substrate to cause a substantial variation in velocity at the frequency of elastic surface waves. No mask is necessary when ion implantation is performed by means of an ion beam converging on the substrate surface; in this case the directive zones can be implanted point by point if the ion beam is given a scanning movement or if the substrate is moved parallel to its surface.

In addition to uses for changing the propagation direction of elastic surface waves, a directive zone can be formed between a transmitting transducer and a receiving transducer to alter the effective acoustic path length between the transducers. A zone of this kind is a means of adjusting the delay time of an elastic surface wave line and is in shape preferably rectangular. This use is shown in FIG. 6 which is a plan view of two collateral delay lines meeting at the surface 2 of a crystalline substrate. A joint transmitting transducer 35, 36 can transmit two beams $\Sigma_1$, $\Sigma_2$ of elastic surface waves which are received by respective transducers 37, 38 and 39, 40. The introduction of a rectangular delaying zone 41 on the path of the beam $\Sigma_2$ is a means of modifying the delay time of one line relatively to the other.

What I claim is:

1. A device for the directive transmission of elastic surface waves, comprising: a crystalline substrate having a surface for propagating said elastic surface waves, and at least one directive zone formed in a portion of said substrate, said directive zone extending immediately below said surface; said directive zone having a permanently modified structure lacking to a substantially degree the regular arrangement of atoms of the lattice structure of the adjacent portions of said substrate, for causing a change in the phase velocity of said elastic surface waves within the extent of said directive zone.

2. A device as claimed in claim 1, wherein said change in the phase velocity consists of an increase in such velocity.

3. A device as claimed in claim 1, wherein said change in the phase velocity consists of a decrease in such velocity.

4. A device as claimed in claim 1, comprising in said surface two directive zones bounding a guide gap of substantially constant width.

5. A device as claimed in claim 1, wherein said directive zone is a wave-guiding zone of substantially constant width: said width being evaluated in said surface along a direction perpendicular to the longitudinal axis of said waveguiding zone.

6. A device as claimed in claim 1, wherein the outline of said directive zone in said surface comprises two outline portions encountered consecutively by said elastic surface waves; said outline portions pertaining to a bounded region in said surface.

7. A device as claimed in claim 6, wherein said outline portions have a uniform separation.

8. A device as claimed in claim 6, wherein the outline portions have a non uniform separation.

9. A device as claimed in claim 6, wherein at least one of the outline portions is straight.

10. A device as claimed in claim 6, wherein at least one of the outline portions is curvilinear.

11. A device as claimed in claim 1, wherein a number of adjacent directive zones is provided for forming an acoustic diffraction network for said elastic surface waves.

12. A device as claimed in claim 11, wherein the pitch of said adjacent directive zones is constant.

13. A device as claimed in claim 11, wherein the pitch of said adjacent directive zones is non uniform.

14. A device as claimed in claim 1, wherein said surface bears conductive electrodes forming at least one elastic surface wave radiation source.

15. A device as claimed in claim 1, wherein the portion of said substrate containing said directive zone is contiguous with said surface.

16. A device as claimed in claim 2, wherein said substrate is made of quartz.

17. A device as claimed in claim 3, wherein said substrate is made of lithium niobate.

18. A method for permanently modifying in the extent of a predetermined zone the phase velocity of elastic surface waves propagated along the surface of a crystalline substrate, said method comprising the steps of: making an ion implanted layer within the extent of said predetermined zone by selectively directing a beam of accelerated ions toward said surface, and varying the accelerating potential of said ions in the course of the implanting for producing an unburied zone having a permanently modified structure lacking to a substantial degree the regular arrangement of atoms of the lattice structure of the adjacent portions of said substrate.

19. A method as claimed in claim 18, wherein said ions are selected amongst the elements helium, lithium, and beryllium.

\* \* \* \* \*